United States Patent
Watkins et al.

(10) Patent No.: US 10,084,435 B2
(45) Date of Patent: Sep. 25, 2018

(54) SYSTEMS AND METHODS FOR A ROBUST DOUBLE NODE UPSET TOLERANT LATCH

(71) Applicants: Adam Watkins, Carbondale, IL (US); Spyros Tragoudas, Carbondale, IL (US)

(72) Inventors: Adam Watkins, Carbondale, IL (US); Spyros Tragoudas, Carbondale, IL (US)

(73) Assignee: Board of Trustees of Southern Illinois University on Behalf of Southern Illinois University Carbondale, Carbondale, IL (US)

( * ) Notice: Subject to any disclaimer, the term of this patent is extended or adjusted under 35 U.S.C. 154(b) by 0 days.

(21) Appl. No.: 15/706,445

(22) Filed: Sep. 15, 2017

(65) Prior Publication Data

US 2018/0076797 A1    Mar. 15, 2018

Related U.S. Application Data

(60) Provisional application No. 62/394,786, filed on Sep. 15, 2016.

(51) Int. Cl.
*H03K 3/037*    (2006.01)
*H03K 19/08*    (2006.01)

(52) U.S. Cl.
CPC ........... *H03K 3/0375* (2013.01); *H03K 19/08* (2013.01)

(58) Field of Classification Search
None
See application file for complete search history.

(56) References Cited

U.S. PATENT DOCUMENTS

| | | | | |
|---|---|---|---|---|
| 7,023,235 B2* | 4/2006 | Hoff | ...................... | G11C 11/4125 326/10 |
| 7,301,362 B2* | 11/2007 | Jang | .................... | H03K 19/0075 326/10 |
| 7,505,304 B2* | 3/2009 | Manohar | ............. | G11C 11/4125 326/12 |
| 8,324,951 B1* | 12/2012 | Zarkesh-Ha | ......... | H03K 3/0375 327/206 |
| 9,780,788 B2* | 10/2017 | Clark | ............... | H03K 19/00392 |

* cited by examiner

*Primary Examiner* — Minh D A
*Assistant Examiner* — James H Cho
(74) *Attorney, Agent, or Firm* — Polsinelli PC

(57) ABSTRACT

Disclosed are a latch circuit and method for preventing double node upsets (DNUs). A first, second, and third storage circuit, each comprising four inputs and an output, are electrically interconnected with a first and second three-input c-element circuit, each comprising three inputs and an output, and a two-input c-element circuit comprising two inputs and an output. The output of the first storage circuit is connected to a first input of the first three-input c-element circuit, a first input of the third storage circuit and a third input of the second storage circuit. The output of the second storage circuit is connected to a second input of the first three-input c-element circuit, a first input of the two-input c-element circuit, and a second input of the second three-input c-element circuit. The output of the third storage circuit is connected to a second input of the two-input c-element circuit, a third input of the first three-input c-element circuit and a third input of the second three-input c-element circuit.

20 Claims, 11 Drawing Sheets

SYSTEMS AND METHODS FOR A ROBUST DOUBLE NODE UPSET TOLERANT LATCH

CROSS REFERENCE TO RELATED APPLICATIONS

This is a non-provisional application that claims benefit to U.S. provisional application Ser. No. 62/394,786 filed on Sep. 15, 2016, which is incorporated by reference in its entirety.

FIELD

The present disclosure generally relates to latch design and in particular to systems and methods for a highly robust, double node upset tolerant latches.

BACKGROUND

As the transistor feature side continuously scales down to improve performance, modern circuitry continues to become more susceptible to radiation induced errors commonly referred to as soft errors. Soft errors can manifest, for example, due to neutron particles originating from space or alpha particles originating from packaging. A soft error occurs when an energetic particle, such as a neutron or an alpha particle, hits the diffusion region of a reverse bias transistor. This, in turn, allows an "off" transistor to temporarily conduct current which can cause a voltage change in a node connected to the affected transistor. If the error occurs in combinational logic, the resulting voltage pulse may be stored in a connected flip flop, thus causing an error. On the other hand, if the error occurs in memory or in a latch during the hold phase, the stored data may change. To mitigate these undesired soft error effects, there is a need for design methodologies that reduce the vulnerability of circuitry to radiation effects.

BRIEF DESCRIPTION OF THE DRAWINGS

The foregoing and other objects, features, and advantages of the present disclosure set forth herein should be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

Corresponding reference characters indicate corresponding elements among the view of the drawings. The headings used in the figures do not limit the scope of the claims.

DETAILED DESCRIPTION

Figure 1:
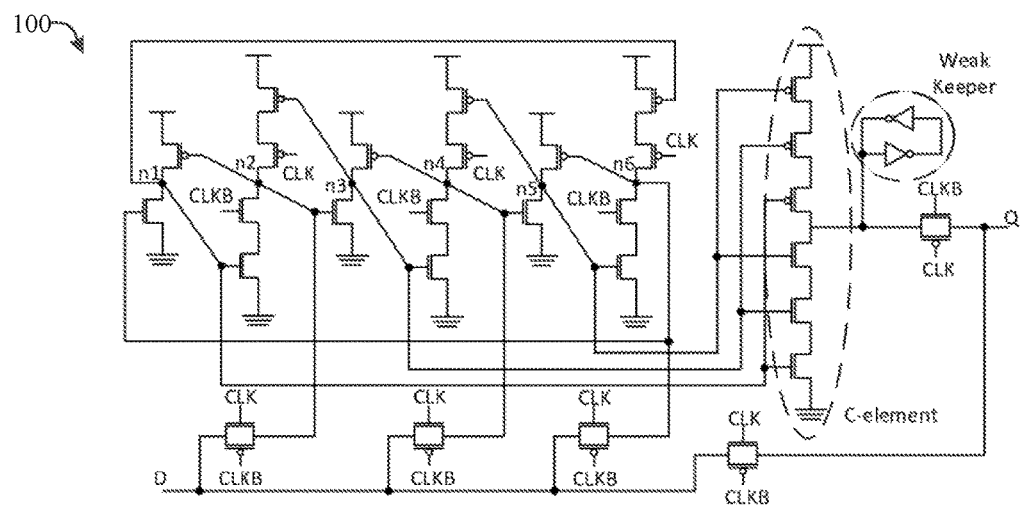
FIG. 1 depicts a prior art HSMUF latch with a weak keeper on the output.

Improving the reliability of latches may be an important element in mitigating the occurrence of radiation errors and soft errors. There has been extensive research in the field of hardening latches against single event upsets (SEUs). The simplest and most common design in safety critical applications is the triple modular redundancy (TMR) latch. This design consists of 3 standard latches connected to a 3-input majority voting circuit. While this design is robust against errors, it has the drawbacks of high area, delay, and power consumption. For this reason there have been many other designs proposed that offer high SEU reliability with various combinations of lower area, lower delay, and lower power consumption. The first and most common cell is the DICE cell proposed in Calin et al. The design in Calin et al. consists of eight cross-coupled PMOS and NMOS transistors connected in series to form four nodes. Due to the relatively high delay and power consumption of the DICE latch, other SEU tolerant latch designs have been proposed that provide reliability by using blocking Muller C-elements, redundancy, or delay in the feedback path.

In more recent times, the further reduction of transistor feature sizes has increased the likelihood of a single event causing a transient on multiple nodes simultaneously, an occurrence commonly referred to as a single event multiple upset (SEMU). This trend necessitates the development of new latch designs that are tolerant to multiple node strikes to guarantee reliability in current and future technologies. As in the SEU case, the goal of these SEMU designs is to minimize the area, delay, and power overheads. However, unlike in the SEU case, these latches are designed to tolerate two simultaneous errors, commonly referred to as a double node upset (DNU). Currently there are existing latch designs that are tolerant to DNUs, as discussed below.

Many modern circuit designs employ a technique commonly referred to as clock gating to further reduce the circuit's power consumption. Clock gating consists of setting the clock to a stable value, i.e. "gating" the clock. If clock gating is used with a latch, it may be necessary to hold the current state for many clock cycles. In the presence of DNUs, such a requirement would increase the likelihood of multiple errors occurring during the hold phase. In many existing DNU tolerant designs, a DNU puts the latch in a vulnerable state in which the correct state could be lost if the latch experiences a further SEU or DNU before the transparent mode. Additionally, in many of these designs, a DNU moves the output to a high impedance state, which implies that the data could discharge if the latch is gated for a sufficient number of cycles. For this reason, there is a need for new designs that are capable of holding the correct output value after a DNU for any given number of clock cycles. For discussion purposes, all DNU tolerant designs are classified as either DNU robust or DNU non-robust. A DNU robust design is defined as being capable of resisting further errors and by not allowing any high impedance states after a DNU occurs. A DNU non-robust design is a latch that does not meet the all of stated criteria.

Currently, there are a few existing DNU tolerant designs. The first proposed design found in Katsarou et al., referred to as the DNCS latch, consists of two DICE cells connected to an output Muller C-element. This design tolerates DNUs since each DICE element requires a DNU to flip its state. Since the assumption is that only two errors can occur at once, in the worst case scenario only one DICE element flips its state. Due to the Muller C-element, the latch output does not change value even if a DICE element flips its state. This design has been shown to be very resilient to DNUs, albeit at a very high cost of area, delay and power overheads. Others have proposed an enhanced design compared to Katsarou et al, where the proposed latch design consists of six dual-input C-elements connected in series, which are then fed into a three-input C-element. Like the DNCS latch, this proposed latch design offers high resiliency to DNUs, but again, with very high power consumption and area overheads.

More recently, a highly area and power efficient design has been proposed in Yan et al. and is referred to as the HSMUF latch. FIG. 1 illustrates an example architecture 100 corresponding to this design. The HSMUF latch uses a TP-DICE structure, which consists of 6 cross-coupled elements, labeled as n1-n6. In the case of a DNU event, if the errors are on adjacent nodes (e.g. a strike on n1 and n2) the TP-DICE element will fully recover the previous state. However, if the strike occurs on two non-adjacent nodes (e.g. a strike on n1 and n4), the TP-DICE element will not be able to fully recover, thereby leaving one output node with an erroneous value, one output node at high impedance, and the remaining output node held at the error free value. To provide reliability, the three output nodes are connected to a C-element, as in FIG. 1, which allows the correct value to be held at the latch output.

While all of the previously discussed designs do provide high DNU reliability, none of them are classified as DNU robust, since a DNU will result in high impedance states on the internal and output nodes and a DNU robust designation requires that high impedance states do not occur after a DNU event. If an error occurs after a DNU, these previously discussed latch designs will flip their held value. A popular remedy to this issue is to place a weak keeper on the latch output as illustrated in example architecture 100 of FIG. 1. However, adding a weak keeper greatly increases the area, delay, and power overheads of the design since the output C-element must be re-sized so that the C-element's driving strength exceeds that of the weak keeper. According to various simulations later discussed herein, the addition of the weak keeper to the HSMUF latch of FIG. 1 nearly triples its power consumption and delay. Additionally, the latch is still vulnerable to error after a DNU event since the TP-DICE will be in a high impedance state.

Figure 2:
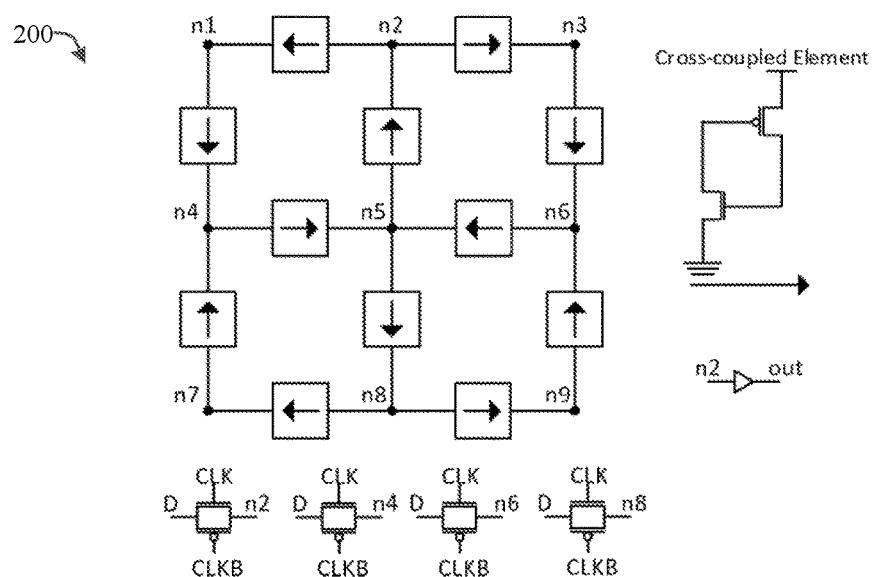
FIG. 2 depicts a prior art DONUT latch.
Figure 3:
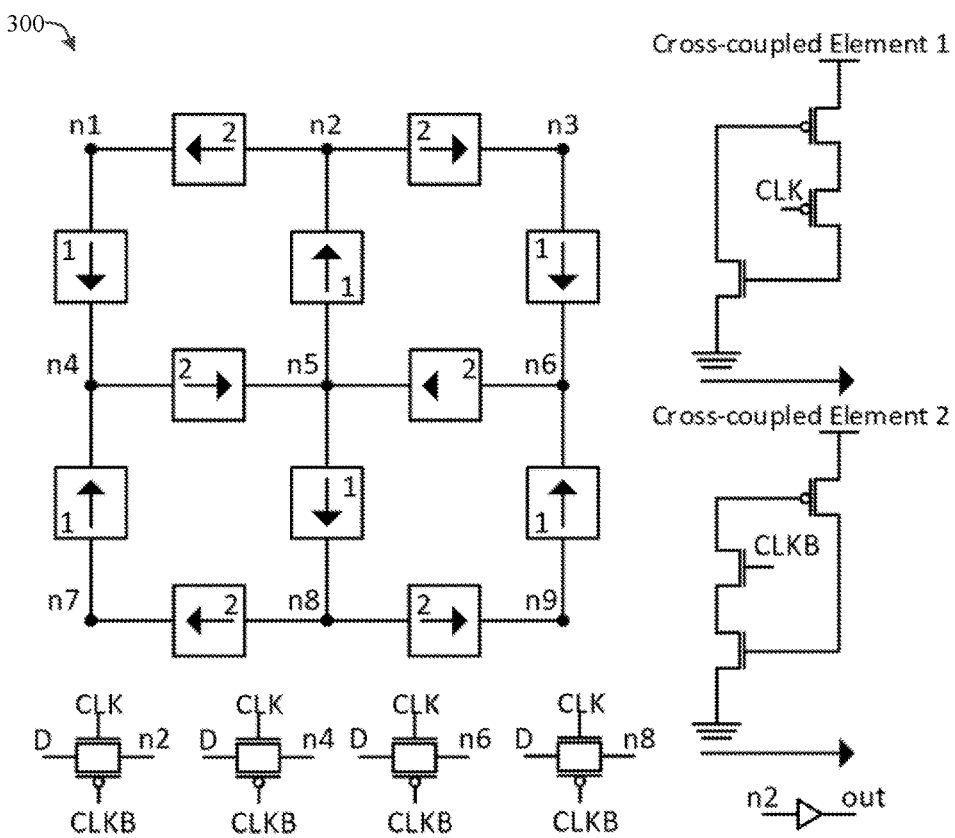
FIG. 3 depicts a prior art modified low-power DONUT latch.

The most efficient existing DNU robust design capable of recovering all nodes after a DNU is the DONUT latch as described in Eftaxiopoulos et al. and shown in the example architecture 200 of FIG. 2. This design uses only 36 transistors, but has a much higher power consumption compared to the HSMUF of FIG. 1. This high power consumption is due to contention on the input lines during the transparent mode. For example, if node n2 in FIG. 2 is observed during the transparent mode, the node is driven by three cross-coupled elements. This contention will increase the amount of time required to change the node n2, thus drastically increasing the dynamic power consumption. To optimize and improve upon the DONUT latch, a 48 transistor DONUT-M latch has been created in which each component connected to an input node is modified, as shown in the example architecture 300 of FIG. 3, such that the line is at high impedance for the whole duration of the transparent mode. This, in effect, removes the data contention problem and thus reduces the overall dynamic power and delay overheads of the design.

Figure 4:
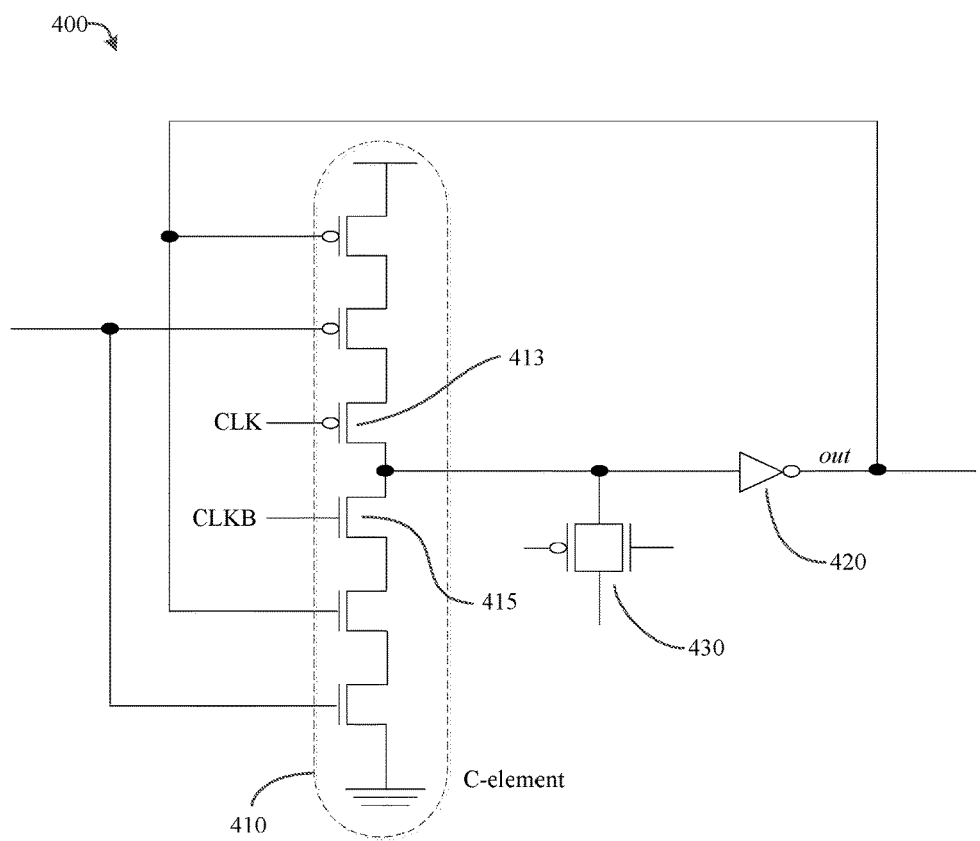
FIG. 4 depicts a basic data storage loop block, according to aspects of the present disclosure.

It is with these observations in mind, among others, that various aspects of the present disclosure were conceived and developed. Aspects of the present disclosure include a DNU robust latch with an implementation that is based on three cross connected storage loops connected to three C-elements. The basic design of an exemplary storage loop 400 is illustrated in FIG. 4. The storage loop 400 is based on a standard latch design, which includes an inverter 420 and a pass gate 430, but is modified with a 3-input C-element 410 inserted to replace an inverter. The purpose of C-element 410 is to separate the feedback loop so that an error will not be held by the loop 400. Additionally, a PMOS 413 is connected to a positive clock signal CLK and an NMOS 415 is connected to a negative clock signal CLKB to remove contention when data is loaded to the latch 430. The addition of these transistors drastically reduces the delay and power consumption of the contemplated design of storage loop 400. However, the storage loop 400 is not robust to error in and of itself. For example, the node out is fed into an input of the 3-input C-element 410. If an error strikes node out, storage loop 400 will never be able to recover its previous state since one of the C-element 410 inputs will be held to an erroneous value by the node out.

Figure 5:
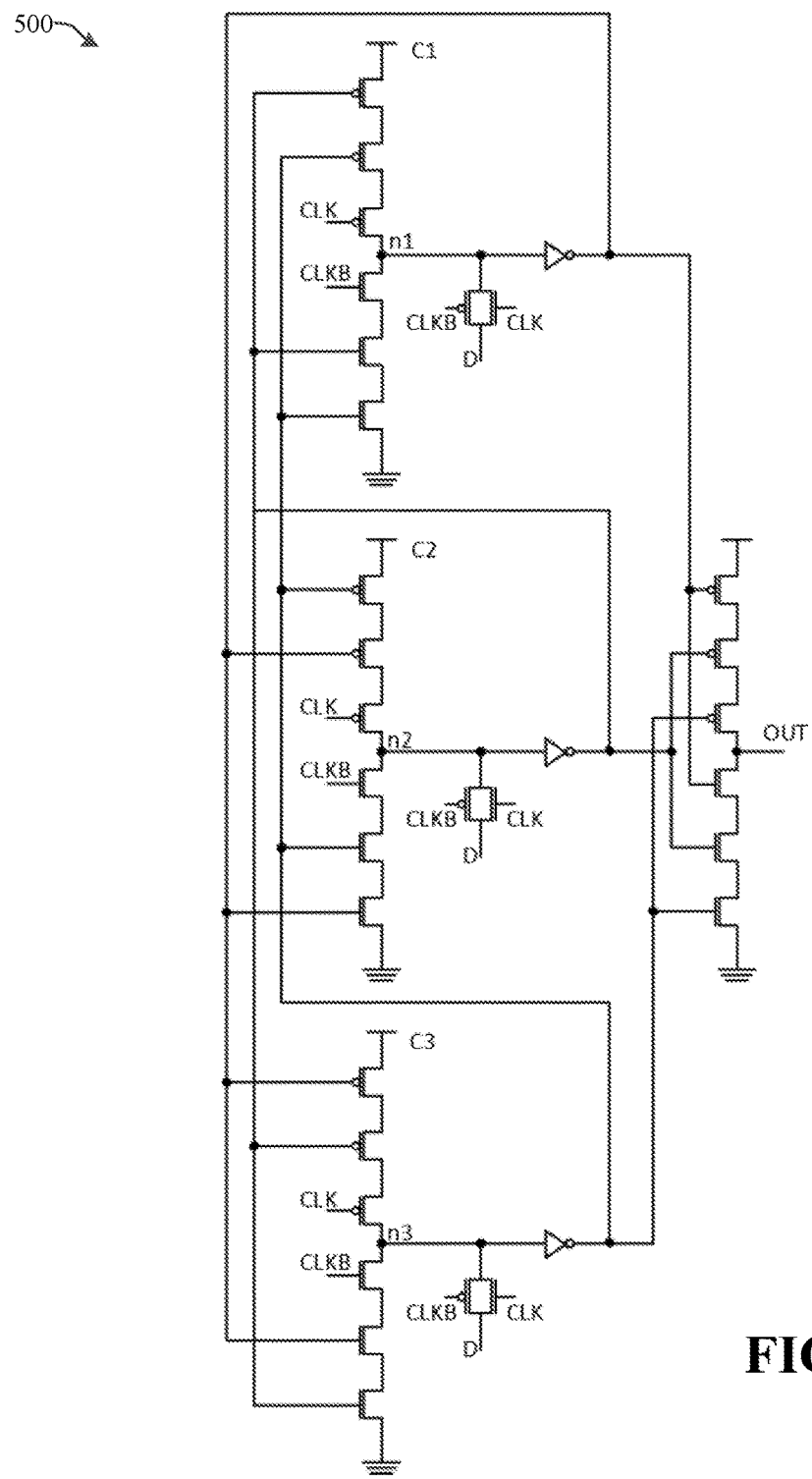
FIG. 5 depicts a schematic of a block-based latch, according to aspects of the present disclosure.

The block based latch 500 of FIG. 5 seeks to solve this issue. Block-based latch 500, illustrated using basic storage blocks, was designed with the goal of ensuring that none of the nodes n1, n2, n3 directly drive themselves. In particular, the latch 500 of FIG. 5 cross-connects three of the storage loop blocks 400 such that each of the three C-elements C1, C2, C3 is driven by three separate block outputs. If a single error occurs on any node in the design of latch 500, the circuit is capable fully recovering.

To demonstrate this, consider a strike on node n2. When the strike occurs, the erroneous value will be propagated to the C-elements C1 and C3, which are driving nodes n1 and n3 respectively. However, since there will be no change on nodes n1 or n3, the C-elements C1 and C3 will hold their previous values, thus preventing the error on n2 from propagating to the output OUT. Additionally, since node n2 is driven by nodes n1 and n3, node n2 will completely recover the correct state.

Figure 7:
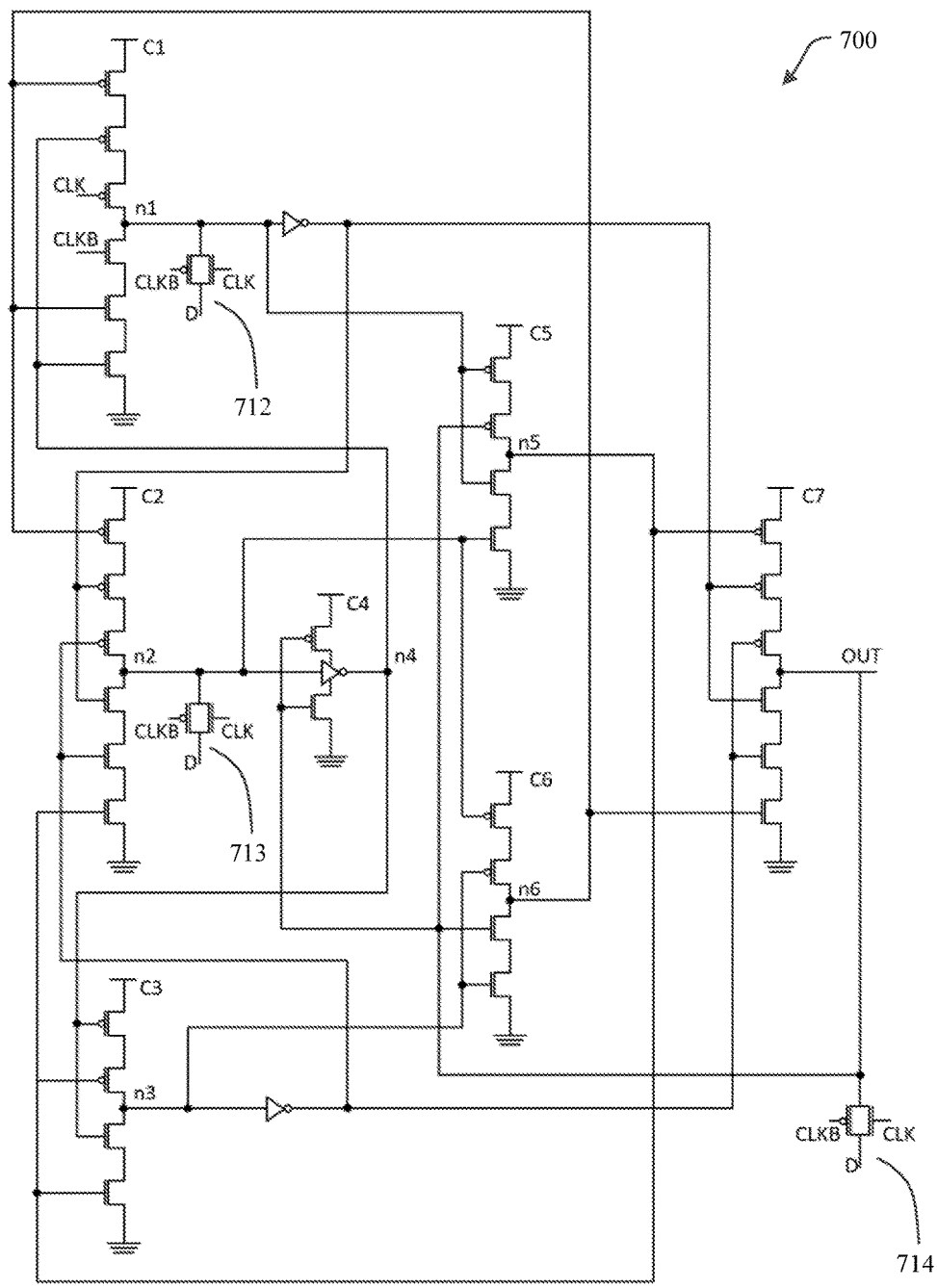
FIG. 7 depicts a schematic HRDNUT latch according to aspects of the present disclosure.
Figure 9:
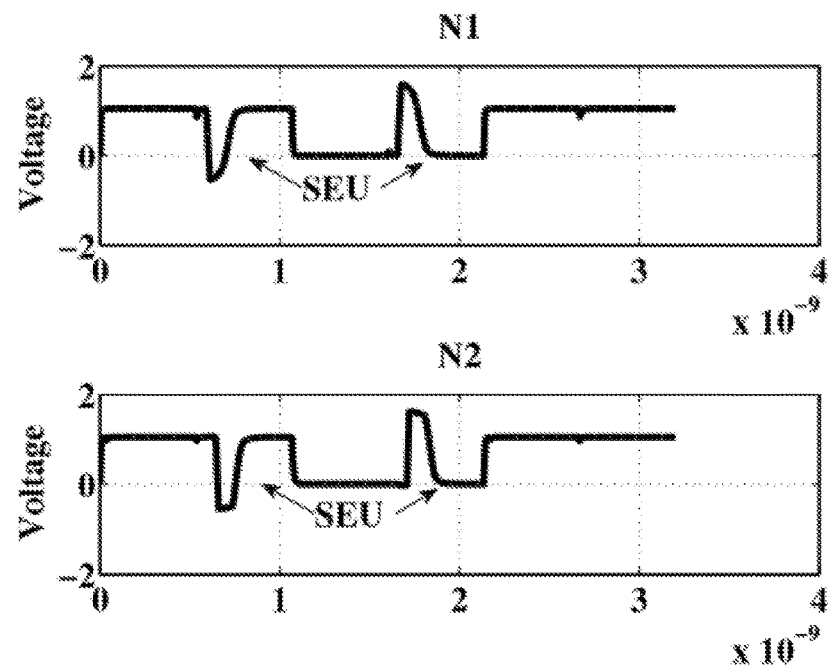
FIG. 9 depicts a node pair (n1, n2) upset and recovery, according to aspects of the present disclosure.
Figure 10:
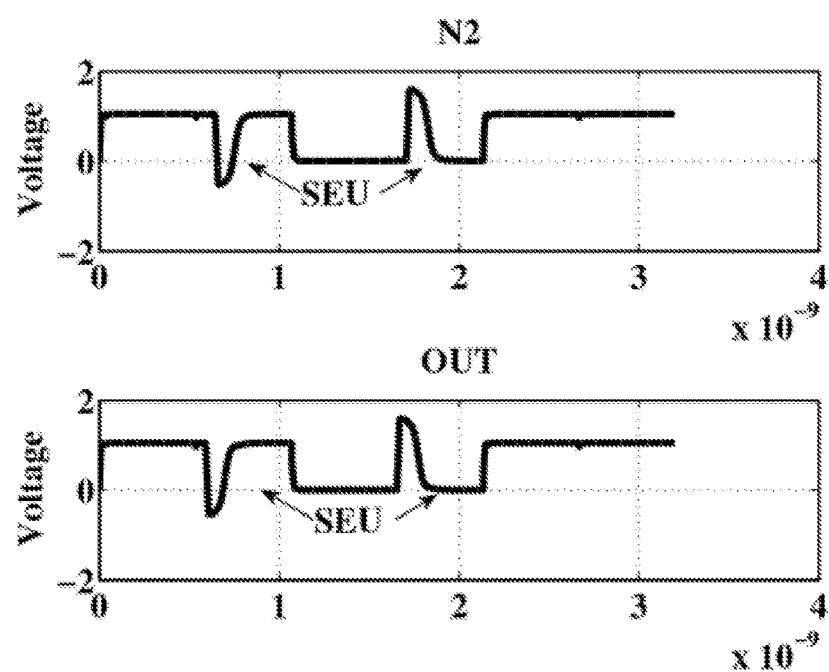
FIG. 10 depicts a node pair (n2, out) upset and recovery, according to aspects of the present disclosure.
Figure 11:
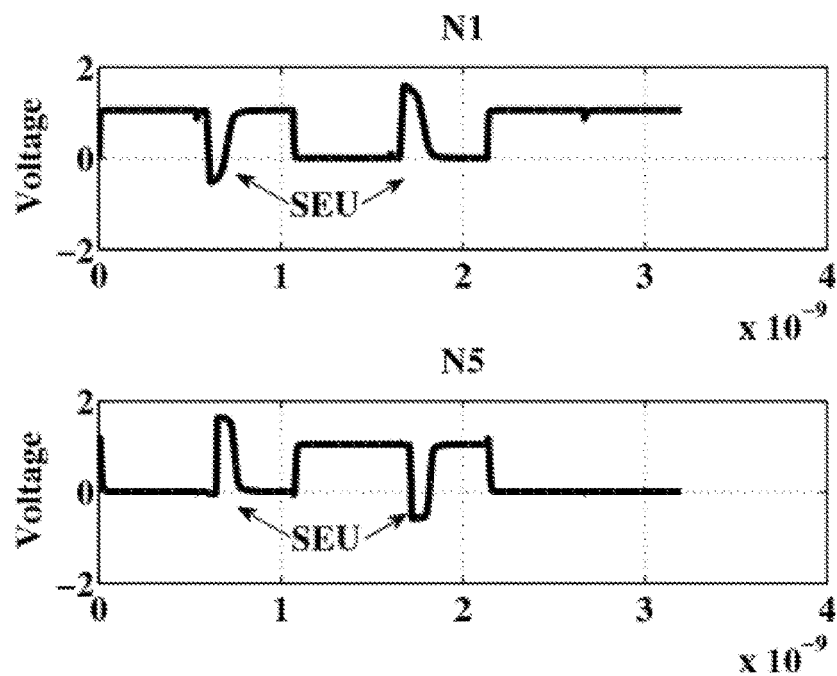
FIG. 11 depicts a node pair (n1, n5) upset and recovery, according to aspects of the present disclosure.
Figure 12:
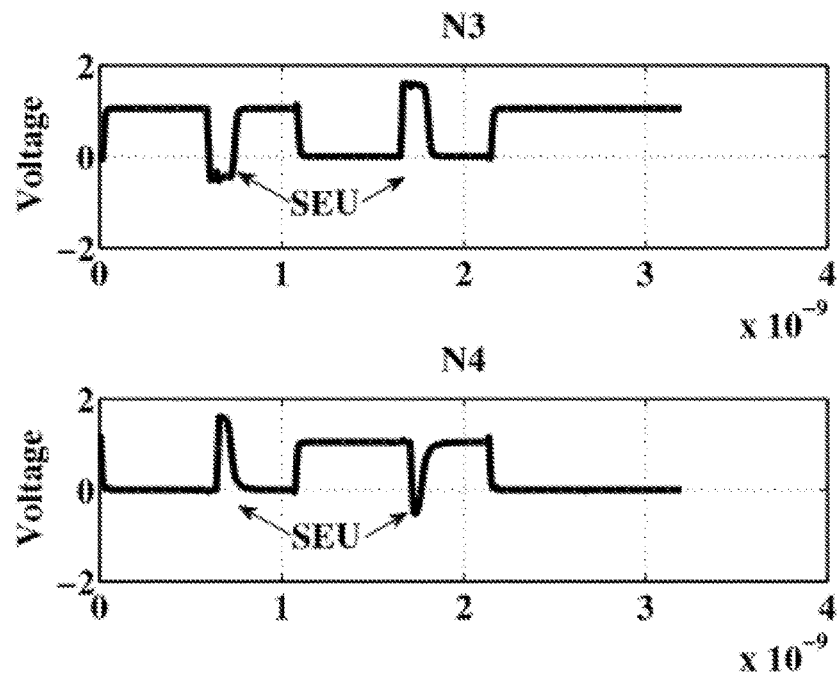
FIG. 12 depicts a node pair (n3, n4) upset and recovery, according to aspects of the present disclosure.
Figure 13:
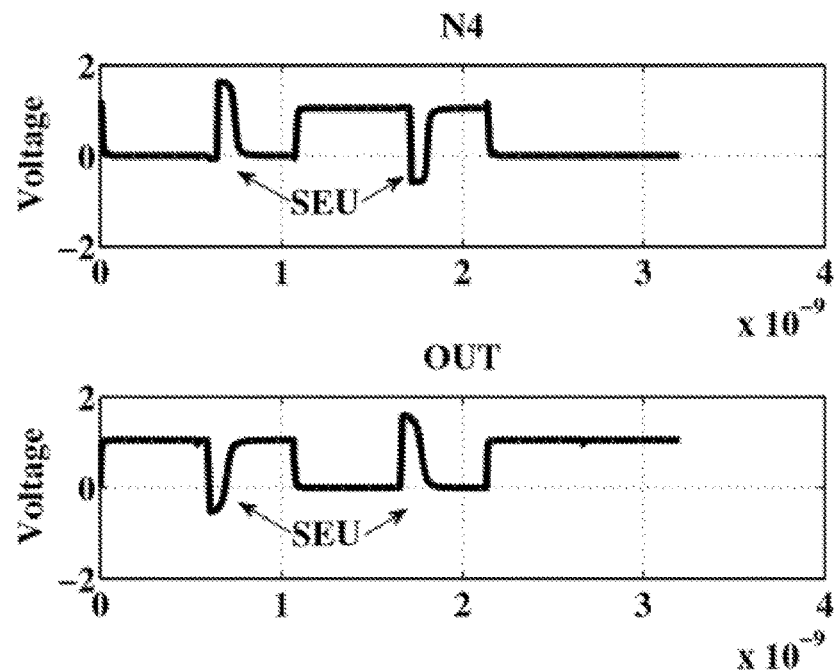
FIG. 13 depicts a node pair (n4, out) upset and recovery, according to aspects of the present disclosure.
Figure 14:
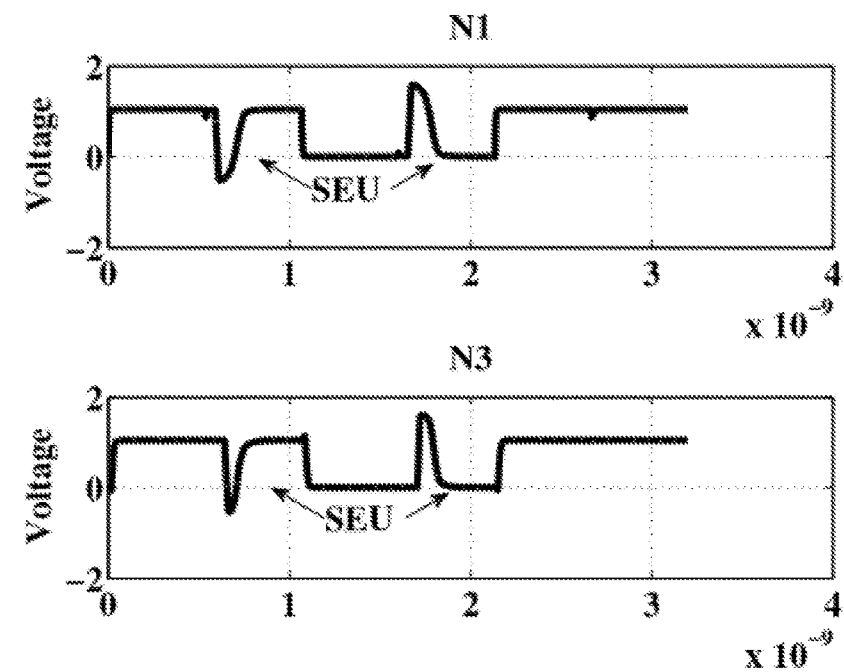
FIG. 14 depicts a node pair (n1, n3) upset and recovery, according to aspects of the present disclosure.
Figure 15:
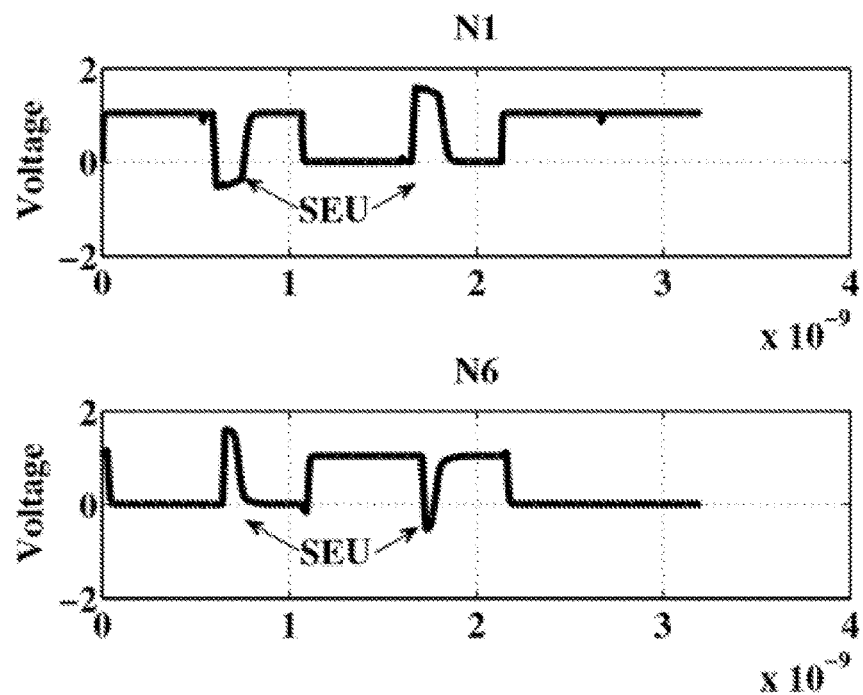
FIG. 15 depicts a node pair (n1, n6) upset and recovery, according to aspects of the present disclosure.
Figure 16:
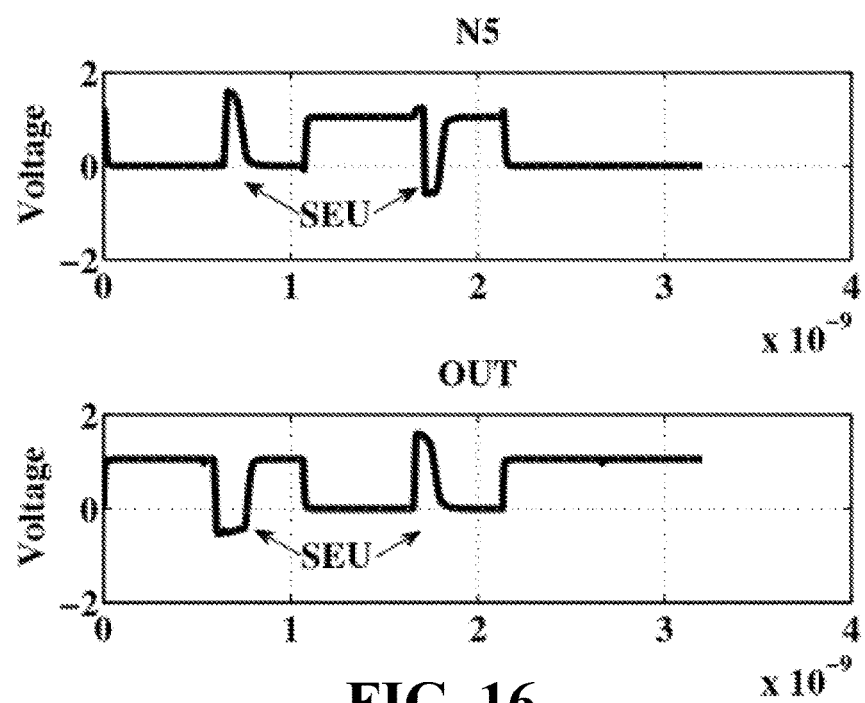
FIG. 16 depicts a node pair (n5, out) upset and recovery, according to aspects of the present disclosure.
Figure 17:
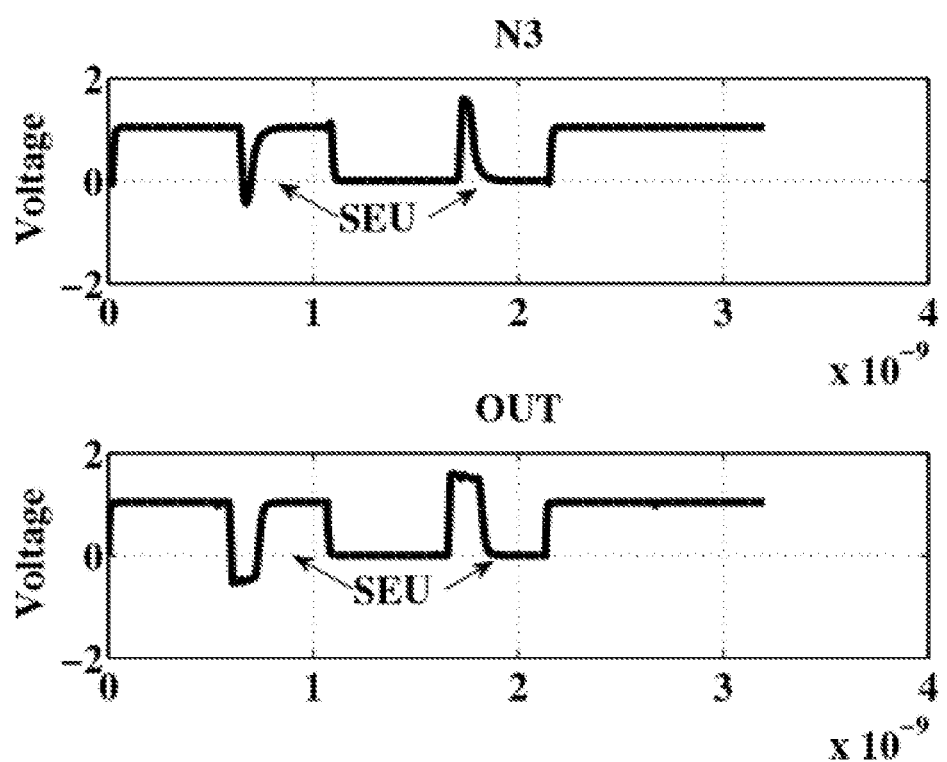
FIG. 17 depicts a node pair (n3, out) upset and recovery, according to aspects of the present disclosure.

A problem, however, with the design of latch 500 is that it is not capable of tolerating DNUs. For example, if an error occurs on both nodes n1 and n2, the corresponding erroneous values will propagate to the inputs of C-element C3 and thereby flip the value of node n3, which thereby changes the ultimate output value of the latch 500. However, since the latch has recovery capability for SEUs, it is contemplated that the latch 500 may be modified to also tolerate DNUs and recover all nodes to the previous state. A schematic of this proposed HRDNUT latch 700 with SEU and DNU tolerance and recovery is illustrated in FIG. 7. The design uses the block-based latch 500 as a basis for modification, the most notable of which is the addition of four more C-elements C4, C5, C6, and C7 to prevent errors from being held in storage loops.

Figure 6:
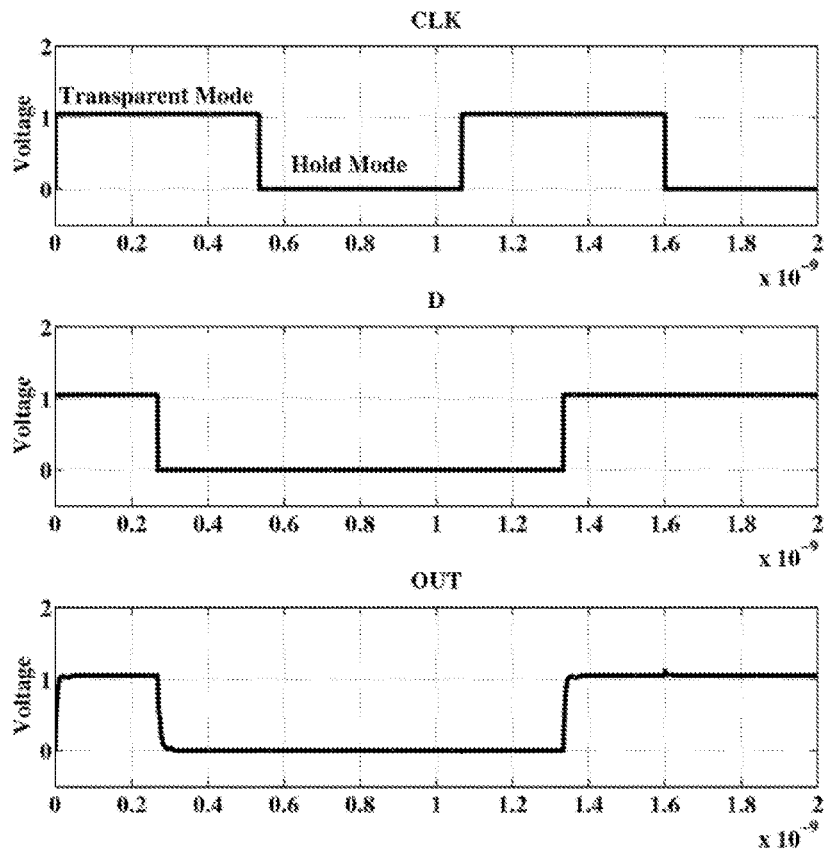
FIG. 6 depicts an illustration of the waveforms of a HRDNUT latch during normal operation, according to aspects of the present disclosure.
Figure 8:
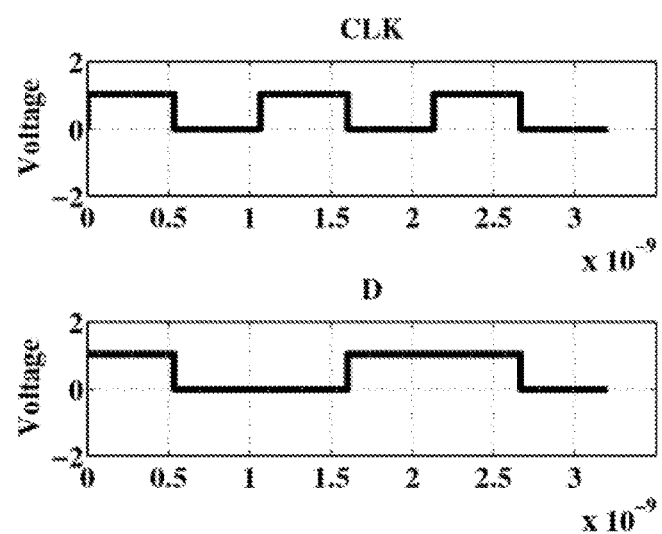
FIG. 8 depicts CLK and D waveforms according to aspects of the present disclosure.

The HRDNUT latch 700 is first described during normal operation. When the positive clock signal (CLK) has a high value and the negative clock signal (CLKB) has a low value, the HRDNUT latch 700 is in transparent mode and the output follows the input. At this stage, the transistors connected to the clock signal in C-element C1 deactivate the PMOS and NMOS stacks thus causing the node n1 to be in a high impedance state. This, in effect, reduces data contention and thus reduces delay and dynamic power consumption. Next, the data ("D") is loaded through pass gates 712, 713, and 714 connected to nodes n1, n2, and out, respectively. Since the output node out is loaded directly, the data-to-out delay is minimized and all nodes are set to their respective error free values. When CLK changes to a low value and CLKB changes to a high value, the HRDNUT latch 700 moves into the hold mode. In this stage, the three pass gates 712, 713, and 714 are deactivated and the state of HRDNUT latch 700 is held since each node is driven to the correct value using a C-element. FIG. 6 illustrates the waveforms of the CLK, D, and OUT nodes for both the transparent and hold modes of operation.

In the case of an SEU, HRDNUT latch 700 retains the excellent resiliency of the block based latch 500 of FIG. 5 and further retains the ability to recover every node after an error. In the case of any internal node being struck by an error, the latch 700 will not change value due to all of the internal C-elements requiring at least two identical input values in order to change values. In the specific case of an error hitting the output node out, the latch 700 will fully recover because out does not directly drive C-element C7, but is instead driven by C7. Thus, the error free output value will be recovered.

Lastly, latch 700 in the case of a DNU is evaluated. Note that unless otherwise stated, it is assumed that the analysis applies to both the scenario in which D=0 and the scenario in which D=1. For the purposes of the analysis described below, the possible DNU strike combinations are categorized into nine distinct cases based on their effect within HRDNUT latch 700. The categories are discussed in greater detail below.

First consider strikes at nodes n1 and n2. In this case, the error at n1 will propagate to C-elements C5 and C7, but will not cause a flip since the error at n2 will be blocked by C-element C4. Additionally, since the inputs of C-elements C1 and C2 are unchanged, the nodes n1 and n2 will recover their initial values. This analysis can be applied to various other DNU strike node combinations containing node n2 since an error at n2 will be blocked by C-element C4.

The exception to this statement is the combination of n2 and out. In the case of a DNU striking nodes n2 and out, the error at n2 will propagate through C-element C4 and node n4. However, C-elements C1 and C3 will subsequently block the error and nodes n1, n3, n5 and n6 will hold their values, thus driving node out to return to the correct state.

Next, consider a case in which a DNU strikes nodes n1 and n5. In this case, the error at node n1 hits the output of C-element C1, which is propagated to C-element C7. The error on node n5 is also propagated to C7. Since none of the inputs to C-element C1 are affected by the error, node n1 is driven to the error-free value which, in turn, drives C5 and n5 to the correct state. The above analysis also applies to a DNU strike on the node combination (n3, n6).

In the case of a DNU hitting nodes n3 and n4, the error at n4 is propagated to C-element C3 and the error at node n3 is propagated to C-elements C7 and C6. After the error on n3 subsides, C4 will drive node n4 and, due to the connection at C3, node n3 back to their error-free values. The node combination (n1, n4) can be analyzed similarly. For the node combinations of (n4, n5) and (n4, n6), the latch will also recover the previous result since the inputs to C-element C4 are unchanged. This implies that after an error occurs at n4, the node n4 will be driven back to the correct value, thus also driving the nodes n5 or n6 back to the correct value.

When a DNU event upsets the combination of n4 and out, the error at out is propagated to C-elements C4, C5 and C6 and the error at n4 is propagated to C1 and C3. Since none of the inputs to C7 are changed by the error, out is flipped back to its error-free value which drives node n4, through C-element C4, back to its previous state.

Consider next the case in which a DNU strikes nodes n1 and n3. In this case, the errors are propagated to C-elements C2, C5, C6 and C7. However, since the n1 and n3 errors do not manifest into an error on any other node, HRDNUT latch 700 fully recovers from the error.

When a DNU strikes the nodes n1 and n6, the error at node n6 propagates to C-elements C1 and C7 while the error at node n1 also propagates to C-element C7. Due to the error-free node n3 driving C7, the previous value is held at the output by C7. Additionally, n3 will drive C6 back to its previous value, thus driving C1 back to the error-free state. This analysis can be applied similarly to the node combination of (n3, n5).

In the case where a DNU strikes node n5 and out, the error at node n5 propagates to C-elements C7, C2 and C3 and the error at out propagates to C-element C4, a PMOS in C5, and an NMOS in C6. When the error-free value at out is 1, the value at n5 will be 0. This DNU strike thus changes the values to 0 and 1, respectively, and the erroneous 0 value at out is propagated to the PMOS in C5 and the NMOS in C6. This, in effect, causes the PMOS in C5 to be activated and the NMOS in C6 to be deactivated. However, since nodes n1 and n2 remain error-free, the NMOS stack of C5 remains active to drive node n5 back to the correct value. This, in turn, forces C-element C7 to also drive out back to the error-free value. In the case where out has an ideal value of 0, the error will be fully recovered since the NMOS stack will be entirely driven by fault-free nodes. The above analysis can similarly be applied to the node combination of (n6, out).

Finally, the node combinations (n1, out), (n3, out) and (n5, n6) are analyzed. In these cases the errors do not cause a change on the inputs of any C-elements driving the node, and thus the previous value will always be recovered.

Simulation Results

The HRDNUT latch 700 was implemented using the 1.05V 32 nm PTM library as described by Zhao et al. and simulated in HSPICE. All transistors were set to the minimum size with the PMOS widths set to W=80 nm and the NMOS widths set to W=40 nm. To evaluate the DNU reliability of the design, current pulses were injected for every possible node strike error combination, including those discussed above. The injection current was calculated using the equation found in Ziegler, which is given below with $\tau$ as the technology dependent constant, $Q_o$ as the injection current value, and t as the variable for time:

$$I(t) = \frac{2Q_o}{\tau\sqrt{\pi}}\sqrt{\frac{t}{\tau}}e^{\frac{-t}{\tau}} \qquad (1)$$

Using Equation (1), τ was set to $32 \times 10^{-12}$ and $Q_o$ was set to 5 fC. In all simulations, the presently disclosed HRDNUT latch was operated at a frequency of 1 Ghz. In FIGS. 9-17, the waveforms for each case presented and discussed above are illustrated to show that HRDNUT latch 700 is fully capable of recovering all nodes in the presence of the various DNU strike combinations.

Next, HRDNUT latch 700 was compared to existing SEU and DNU tolerant latches and methods. As in HRDNUT latch 700, all latches under analysis and comparison were designed using the 32 nm PTM library and operated at 1 Ghz. For the analysis, HRDNUT latch 700 was compared to the following SEU tolerant latches: DICE, FERST and HIPER. Additionally, HRDNUT latch 700 was also compared to the following DNU tolerant designs: DNCS, Interception, HSMUF and DONUT. All transistors for the implemented latches were set to minimum width and length except for the designs that use a C-element with a weak keeper. In these designs, the C-element PMOS width was set to W=320 nm, the NMOS width was set to W=160 nm, the weak keeper was sized to be at minimum width, and the C-elements were sized so that the output driving strength did not allow the weak keeper to drive an erroneous value in the event of an error.

To provide a fair comparison, the propagation delay, average power consumption and area of all of the aforementioned designs were measured and the designs categorized based on whether they can tolerate a DNU and whether they are robust from error after a DNU occurs (recalling that a DNU robust design is defined as being capable of resisting further errors and by not allowing any high impedance states after a DNU occurs). The delay was measured as the time between when a transition occurs on input D to when a transition was observed on the output. The average power was computed using the error-free operation for each latch for a duration of 200 ns. To compare the area overhead, the unit size transistor (UST) metric was adopted as in Katsarou et al., which represents the number of unit sized (with a minimum width W=40 nm in this case) transistors required for the design. Table I below provides the results of these simulations.

TABLE I

SPICE Simulations of Existing Latches using the 1.05 V 32 nm PTM library

| Latch | DNU Immune | DNU Robust | Power (μW) | Delay (ps) | Area (UST) |
|---|---|---|---|---|---|
| DICE | No | No | 1.332 | 8.145 | 16 |
| FERST | No | No | 3.178 | 31.648 | 60 |
| HIPER | No | No | 1.292 | 2.221 | 27 |
| DNCS | Yes | No | 4.948 | 22.486 | 61 |
| Interception | Yes | No | 5.606 | 79.168 | 89 |
| HSMUF | Yes | No | 1.871 | 1.0626 | 51 |
| HSMUF (with keeper) | Yes | No | 3.787 | 3.945 | 78 |
| DONUT | Yes | Yes | 4.021 | 14.722 | 54 |
| DONUT-M | Yes | Yes | 2.760 | 8.421 | 72 |
| HRDNUT | Yes | Yes | 2.450 | 2.310 | 66 |

According to the simulation results presented in Table I, the only DNU robust designs are the two DONUT latch implementations and the presently disclosed HRDNUT latch 700. Compared to the DONUT-M modified latch, the disclosed HRDNUT latch provides DNU robustness while reducing the power consumption by 11.3%, reducing the number of transistors by 8.33%, and reducing the delay by 72.5%.

For the above reasons, the HRDNUT latch is the best design for clock gating applications due to its high robustness even after a DNU occurs and its lower power, area, and delay overheads. Since clock gating may require the latch to remain in a hold state for many clock cycles, the susceptibility of error increases. In many existing designs, a DNU may either change the state of the latch or push the latch into a state where the output may discharge over time due to high impedance. A common method to solve this problem is the addition of a weak keeper on the output. However, as shown and discussed above, the addition of the keeper causes much higher power consumption. Since the presently disclosed HRDNUT latch does not remain in a high impedance state after a DNU occurs, the disclosed HRDNUT latch provides high reliability during the whole duration of the hold mode while simultaneously providing the lowest delay, power and area compared to other latches suitable for clock gating.

What is claimed is:

1. A double node upset (DNU) tolerant latch circuit comprising:
    a first storage circuit, a second storage circuit, and a third storage circuit, each comprising four inputs and an output;
    a first three-input c-element circuit comprising three inputs and an output; and
    a first two-input c-element circuit comprising two inputs and an output,
    wherein the output of the first storage circuit is electrically connected to a first input of the first three-input c-element circuit and a first input of the third storage circuit, the output of the second storage circuit is electrically connected to a second input of the first three-input c-element circuit and a first input of the first two-input c-element circuit, and the output of the third storage circuit is electrically connected to a second input of the first two-input c-element circuit and a third input of the first three-input c-element circuit, the output of the third storage circuit comprising the output of the DNU tolerant latch circuit.

2. The DNU tolerant latch circuit of claim 1 further comprising:
    a second three-input c-element circuit comprising three inputs and an output, where the output of the second three-input c-element circuit is electrically connected to a first input of the first storage circuit, a first input of the second storage circuit, and a second input of the third storage circuit.

3. The DNU tolerant latch circuit of claim 2 further comprising:
    a second two-input c-element circuit comprising two input and an output, where the output of the second two-input c-element circuit is electrically connected to a second input of the second storage circuit, a first input of the second three-input c-element circuit, and a third input of the third storage circuit.

4. The DNU tolerant latch circuit of claim 3 wherein the output of the first storage circuit is further electrically connected to a third input of the second storage circuit.

5. The DNU tolerant latch circuit of claim 3 wherein the output of the second storage circuit is further electrically connected to a second input of the second three-input c-element circuit.

6. The DNU tolerant latch circuit of claim 3 wherein the output of the third storage circuit is further electrically connected to a third input of the second three-input c-element circuit.

7. The DNU tolerant latch circuit of claim 3 wherein the output of the first three-input c-element is electrically connected to a fourth input of the third storage circuit, a first input of the second two-input c-element circuit, and a fourth input of the second storage circuit.

8. The DNU tolerant latch circuit of claim 3 wherein the output of the first two-input c-element circuit is further electrically connected to a second input of the first storage circuit and a second input of the second two-input c-element circuit.

9. The DNU tolerant latch circuit of claim 3 wherein each of the first storage circuit, the second storage circuit, and the third storage circuit comprises a four-input c-element circuit and a latch.

10. The DNU tolerant latch circuit of claim 9 wherein the four-input c-element circuit of the first storage circuit, the second storage circuit, and the third storage circuit comprises a plurality of transistor devices connected in series, the plurality of transistor devices comprising a first subset of PMOS transistors and a second subset of NMOS transistors.

11. The DNU tolerant latch circuit of claim 3 wherein each of the first three-input c-element circuit and the second three-input c-element circuit comprises four transistor devices connected in series, a first subset of the four transistor devices comprising PMOS transistors and a second subset of the four transistor devices comprising NMOS transistors.

12. The DNU tolerant latch circuit of claim 1 wherein a third input of the first storage circuit is electrically connected to a clock signal.

13. A method for preventing double node upsets (DNUs) in a latch circuit, the method comprising:
   electrically interconnecting:
      a first storage circuit, a second storage circuit, and a third storage circuit, each comprising four inputs and an output;
      a first three-input c-element circuit and a second three-input c-element circuit, each comprising three inputs and an output; and
      a first two-input c-element circuit comprising two inputs and an output;
   wherein the output of the first storage circuit is electrically connected to a first input of the first three-input c-element circuit, a first input of the third storage circuit and a third input of the second storage circuit; the output of the second storage circuit is electrically connected to a second input of the first three-input c-element circuit, a first input of the first two-input c-element circuit, and a second input of the second three-input c-element circuit; and the output of the third storage circuit is electrically connected to a second input of the first two-input c-element circuit, a third input of the first three-input c-element circuit and a third input of the second three-input c-element circuit.

14. The method of claim 13 wherein the output of the second three-input c-element circuit is electrically connected to a first input of the first storage circuit, a first input of the second storage circuit, and a second input of the third storage circuit.

15. The method of claim 14 further comprising:
   electrically connecting a second two-input c-element circuit comprising two input and an output, wherein the output of the second two-input c-element circuit electrically connected to a second input of the second storage circuit, a first input of the second three-input c-element circuit, and a third input of the third storage circuit.

16. The method of claim 15 wherein the output of the first three-input c-element is electrically connected to a fourth input of the third storage circuit, a first input of the second two-input c-element circuit, and a fourth input of the second storage circuit.

17. The method of claim 15 wherein the output of the first two-input c-element circuit is further electrically connected to a second input of the first storage circuit and a second input of the second two-input c-element circuit.

18. The method of claim 15 wherein the four-input c-element circuit of the first storage circuit, the second storage circuit, and the third storage circuit comprises a plurality of transistor devices connected in series, the plurality of transistor devices comprising a first subset of PMOS transistors and a second subset of NMOS transistors.

19. The method of claim 15 wherein each of the first three-input c-element circuit and the second three-input c-element circuit comprises four transistor devices connected in series, a first subset of the four transistor devices comprising PMOS transistors and a second subset of the four transistor devices comprising NMOS transistors.

20. The method of claim 13 wherein each of the first storage circuit, the second storage circuit, and the third storage circuit comprises a four-input c-element circuit and a latch.

* * * * *